United States Patent
Watson

(10) Patent No.: US 6,191,622 B1
(45) Date of Patent: Feb. 20, 2001

(54) TIME INTERLEAVED COMMON MODE FEEDBACK CIRCUIT WITH PROCESS COMPENSATED BIAS

(75) Inventor: Minh Watson, Fremont, CA (US)

(73) Assignee: ATI International SRL, Christ Church (BB)

( * ) Notice: Under 35 U.S.C. 154(b), the term of this patent shall be extended for 0 days.

(21) Appl. No.: 09/165,181

(22) Filed: Oct. 1, 1998

(51) Int. Cl.[7] .................................................. H03K 5/22
(52) U.S. Cl. .................................................. 327/65; 327/91
(58) Field of Search .................................... 327/363, 312, 327/322, 332, 323, 182, 65, 67, 91, 337; 323/315, 313, 312; 330/9, 258, 259

(56) References Cited

U.S. PATENT DOCUMENTS

| | | | |
|---|---|---|---|
| 5,894,284 | * 7/1999 | Garrity et al. | 341/172 |
| 5,923,206 | * 7/1999 | Levinson | 327/362 |
| 5,973,540 | * 7/1999 | Boisvert | 327/362 |

* cited by examiner

Primary Examiner—Toan Tran
Assistant Examiner—Hiep Nguyen
(74) Attorney, Agent, or Firm—Skjerven Morrill MacPherson LLP; Edward C. Kwok

(57) ABSTRACT

A time-multiplexed common mode feedback circuit provides a common mode feedback signal during active phases of a clock signal. The common mode feed back circuit includes capacitors which are charged during the inactive phases of the clock signals. In one embodiment, the common mode feedback signal is provided by two generator circuits each driven by a respective one of two non-overlapping clock signals. In that embodiment, the generator circuits provide the common mode feedback signal during the active phases of their respective clock signals.

12 Claims, 2 Drawing Sheets

TIME INTERLEAVED COMMON MODE FEEDBACK CIRCUIT WITH PROCESS COMPENSATED BIAS

BACKGROUND OF THE INVENTION

1. Field of the Invention

The present invention relates to differential amplifiers and bias circuits often used in conjunction with differential amplifiers. In particular, the present invention relates to providing a low-noise common mode feedback signal for adjusting common mode output voltage of a differential amplifier, and a bias current source which is immune to process variations.

2. Discussion of the Related Art

Differential amplifiers are building blocks of many analog circuits, especially analog amplifiers circuits in which high gain and high signal fidelity are required. An example of such an analog amplifier circuit can be a digital-to-analog conversion circuit suitable for use in computer graphics applications. To achieve the goals of high gain and high signal fidelity, differential amplifiers are required to have high common mode rejection, so as to provide the requisite dynamic output range.

Bias circuits are often used in conjunction with many applications of a differential amplifier. In an analog integrated circuit, for example, a bias circuit is often used to generate a reference current, which is then mirrored throughout the integrated circuit as a reference bias current wherever such a current is needed. However, variations in the manufacturing process of transistor current mirrors can result in significant variations in the mirrored current. For example, a 10% variation in the channel length of an MOS transistor in a current mirror can result in a more than 10% variation in the mirrored current.

Current sources are also extensively used with differential amplifiers. For example, a current source is frequently found in an input stage of a differential amplifier. Such a current source preferably has high noise-immunity and a high output impedance.

SUMMARY OF THE INVENTION

According to one aspect of the present invention, a feedback circuit in a differential amplifier provides a common mode feedback signal based on the common mode component of a differential output signal of the differential amplifier. The common mode output circuit includes (a) a first generator circuit providing, during an active phase of the first clock signal, a voltage approximating a common mode component of the differential signal plus a bias voltage; and (b) a second generator circuit also providing the voltage approximating the common mode component of the differential signal plus the bias voltage, but during an active phase of the a second clock signal, which is active when the first clock signal is inactive.

In one embodiment, the common mode feedback circuit includes, in each generator circuit, one or more capacitors which are charged during an inactive phase of the clock signal associated with the generator circuit. The charge in the capacitors provides the requisite bias voltage in the common mode feedback signal. A control circuit multiplexes each generator circuit between providing the common mode feedback signal and charging the capacitors to provide the bias voltage. The control circuit includes a number of transistor switches each controlled by an appropriate clock signal.

In one embodiment, in each generator circuit, the capacitors are configured such that, during the inactive phase of the clock signal associated with the generator circuit, the capacitors are coupled in parallel for charging by a current source and, during the active phase of the clock signal, the capacitors are coupled in series. In that series configuration, the differential signal is coupled across the series capacitors and a common terminal of the capacitor provides the common mode feedback signal.

According to another aspect of the present invention, a current source compensated for process variation includes (a) a first transistor of a first channel length receiving a reference voltage at a control terminal and generating a first current at an output terminal, and (b) a second transistor of a second channel length much longer than the channel length of the first transistor, receiving at its control terminal the reference voltage and generating at its output terminal a second current. The first and second currents are combined to provide the output current of compensated current source. Because of its much longer channel length, the second transistor is much less sensitive to channel length variations resulting from process variations. Thus, the second transistor can provide a compensating current that is insensitive to the process variations affecting the first transistor, while the first transistor can provide the high current output required. In some applications, especially in differential amplifiers, the bandwidth of a differential amplifier can be significantly enhanced by a bias current from a compensated current source of the present invention.

The present invention is better understood upon consideration of the detailed description below, in conjunction with the accompanying drawings.

DETAILED DESCRIPTION OF THE PREFERRED EMBODIMENTS

Figure 1A:
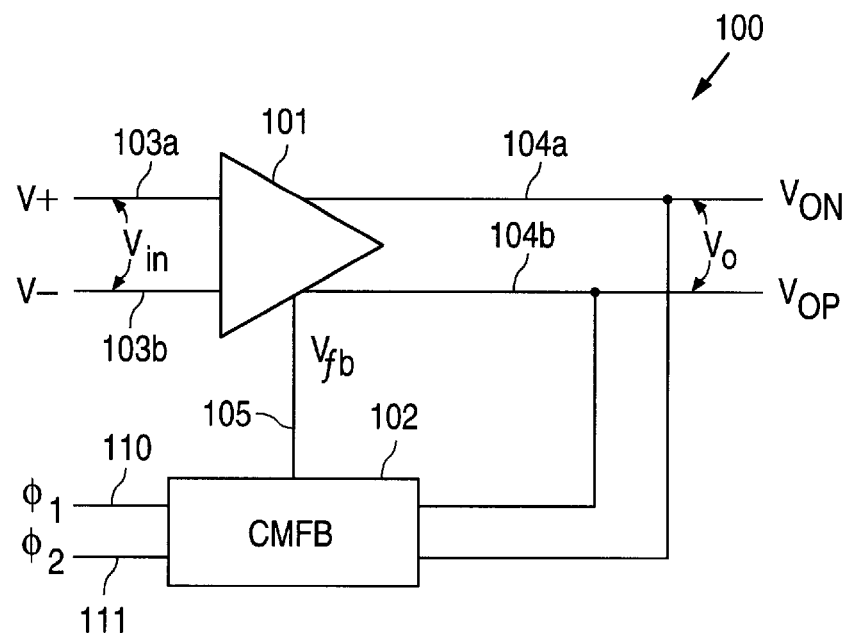
FIG. 1a shows schematically a differential amplifier circuit 100 including a time-interleaved common mode feedback circuit 102, in accordance with the present invention.

The present invention provides a time-interleaved common mode feedback circuit using non-overlapping clock signals. One embodiment of the present invention in a differential amplifier 100 is shown schematically in FIG. 1a. As shown in FIG. 1a, a differential amplifier circuit 100 includes a differential amplifier 101, which receives a differential signal $V_{in}$ across input terminals 103a and 103b and provides a differential output signal $V_o$ across terminals 104a and 104b. A common mode feedback circuit ("CMFB circuit") 102, discussed in further detail below, receives differential output signal $V_o$, and provides an output signal $V_{fb}$ (terminal 105), which is used to diminish any common mode component of output signal $V_o$ across terminals 104a and 104b. In differential amplifier circuit 100, CMFB circuit 102 receives non-overlapping clock signals $\phi_1$ and $\phi_2$ on terminals 110 and 111 respectively. Clock signals $\phi_1$ and $\phi_2$ are used to charge capacitors in CMFB circuit 120.

Figure 1B:
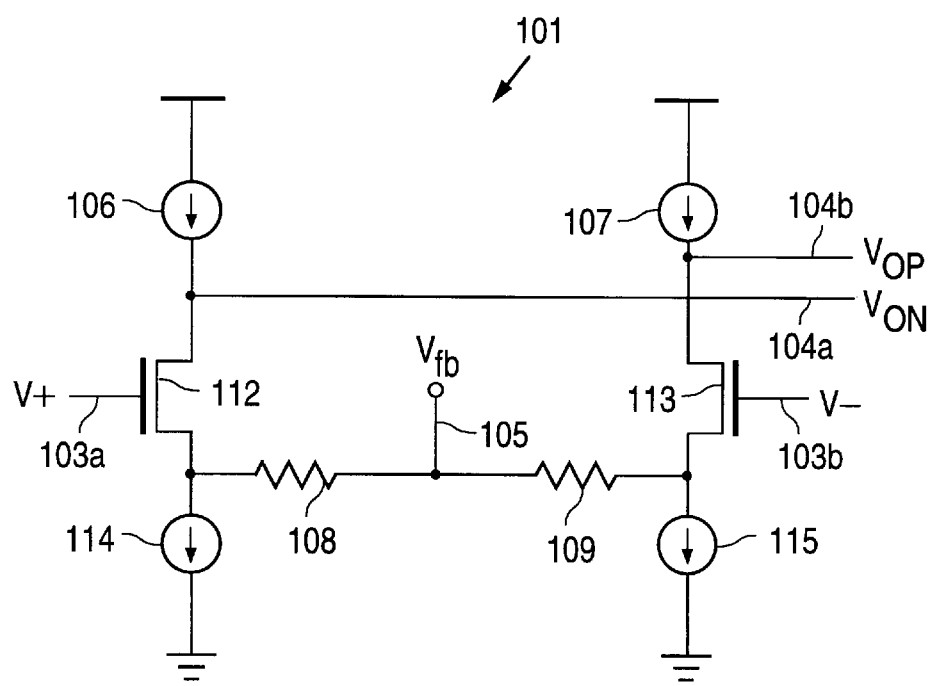
FIG. 1b shows schematically differential amplifier 101 of FIG. 1a's differential amplifier circuit 100.

FIG. 1b is a schematic circuit for differential amplifier 101 of FIG. 1a. As shown in FIG. 1b, differential input signal $V_{in}$ across terminals 103a and 103b control the gate terminals of transistors 112 and 113, which receive currents from current sources 106 and 107. Voltage $V_{in}$ thus controls the relative magnitudes of current flowing in transistors 112 and 113, thereby providing an amplified output signal $V_o$ across terminals 104a and 104b. Common mode feedback signal $V_{fb}$ is received at terminal 105. Common mode feedback signal $V_{fb}$ operates to diminish any common mode offset voltage in output signal $V_o$ of terminals 104a and 104b through resistors 108 and 109 respectively.

Figure 1C:
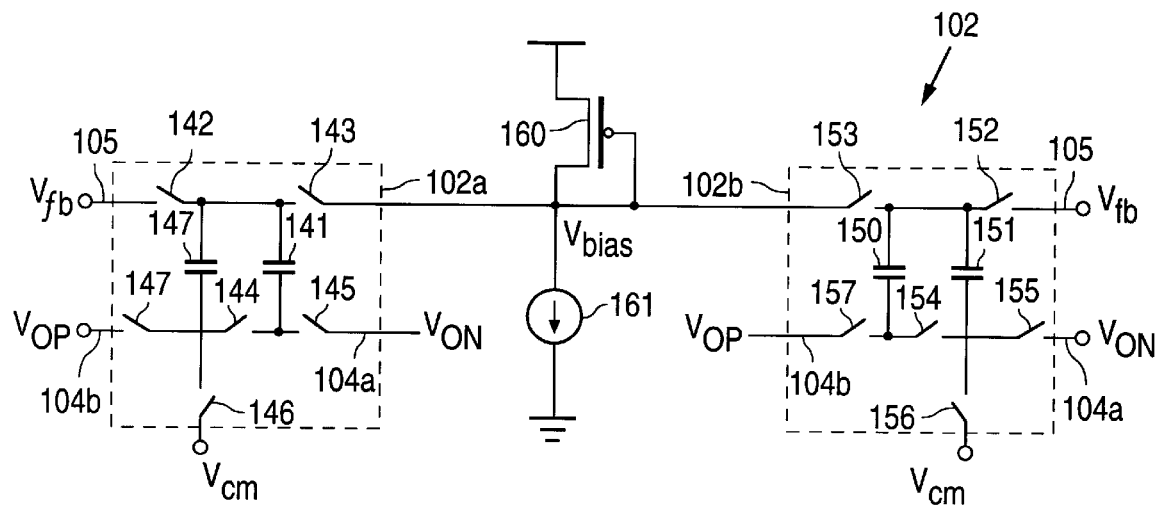
FIG. 1c shows schematically CMFB circuit 102 of FIG. 1a's differential amplifier circuit 100, in accordance with the present invention.

FIG. 1c shows schematically CMFB circuit 102 of FIG. 1a. As shown in FIG. 1c, CMBF circuit 102 includes feedback generator circuits 102a and 102b. In CMBF circuit 102, diode-connected PMOS transistor 150 and current source 161 provide a bias voltage $V_{bias}$ which is used, in conjunction with a reference voltage $V_{CM}$, to charge capacitors 140, 141, 150 and 151 in the manner described below. CMFB circuit 102 also includes switches 142–147 and 152–157, each of which is controlled by one of the non-overlapping clock signals $\phi_1$ or $\phi_2$.

In CMBF circuit 102, clock signal $\phi_1$, when active (i.e., at logic high), closes switches 142, 145, 147, 153, 154 and 156. Concurrently, clock signal $\phi_2$ opens switches 143, 144, 146, 152, 155 and 157. Thus, when clock signal $\phi_1$ is active, capacitors 140 and 141 are coupled serially between terminals 104a and 104b and capacitors 150 and 151 are coupled in parallel between reference signals $V_{bias}$ and $V_{CM}$ for charging. In this configuration, capacitors 150 and 151, each having a capacitance C, is charged to a charge Q according to:

$$CQ=(V_{bias}-V_{CM})$$

Concurrently, because of charge sharing at capacitors 140 and 141, signal $V_{fb}$ at terminal 105 has a magnitude which is equal to any common mode offset voltage in $V_o$ plus an offset voltage equal to $(V_{bias}-V_{CM})$ Specifically, the following equations hold:

$$V_{fb}=CQ_1+V_{ON}$$

$$V_{fb}=C(2Q-Q_1)+V_{OP}$$

where $V_{ON}$ and $V_{OP}$ are the voltages at terminals 104b and 104a respectively. Thus, $$V_{fb} = (V_{bias} - V_{CM}) + \frac{V_{ON} + V_{OP}}{2}$$

Therefore, voltage $V_{fb}$ is the common mode offset voltage in $V_o$ plus the bias voltage $(V_{bias}-V_{CM})$. By canceling the common mode offset voltage through the feedback signal $V_{fb}$, differential amplifier 101 continues to have a high common mode rejection. CMFB circuit 102 is advantageous because the bias voltage allows CMFB circuit 120 to operate even when $V_o$ is very small.

Similarly, clock signal $\phi_2$, when active, closes switches 152, 155, 157, 143, 144 and 146. Concurrently, clock signal $\phi_2$ opens switches 142, 145, 147, 153, 154 and 156. Thus, when clock signal $\phi_2$ is active, capacitors 150 and 151 are coupled serially between terminals 104a and 104b and capacitors 140 and 141 are coupled in parallel between reference signals $V_{bias}$ and $V_{CM}$ when charging.

Figure 1D:
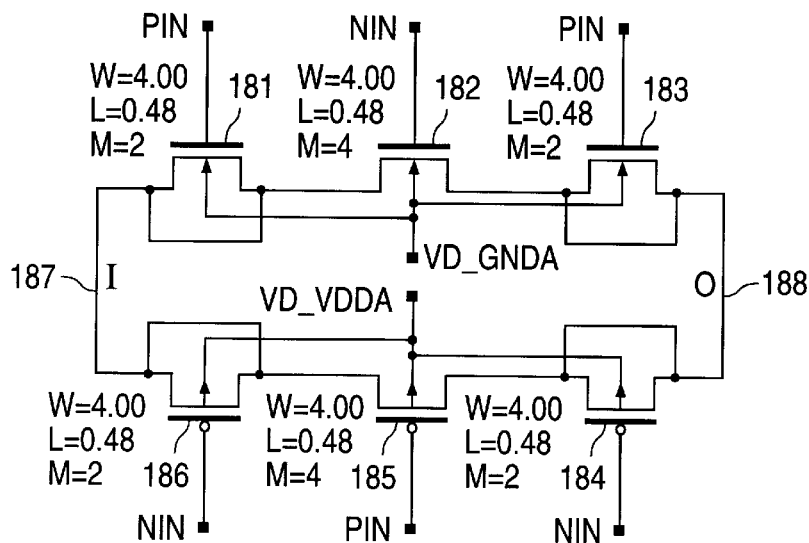
FIG. 1d shows a switch 180, which can be used to implement any of switches 142–147 and 152–157 of FIG. 1c.

FIG. 1d shows a switch 180, which can be used to implement any of switches 142–147 and 152–157. As shown in FIG. 1d, switch 180 includes NMOS transistors 181–183 and PMOS transistors 184–186. In switch 180, the gate terminals of transistors 182, 184 and 186 are driven by a clock signal $\phi$, while transistors 181, 183 and 185 are driven by the clock signal $\phi'$, which is the complement signal of clock signal $\phi$. Accordingly, input node 187 is coupled to output node 188, when clock signal 100 is active, and isolated from output node 188, when clock signal $\phi$ is inactive.

Figure 2:
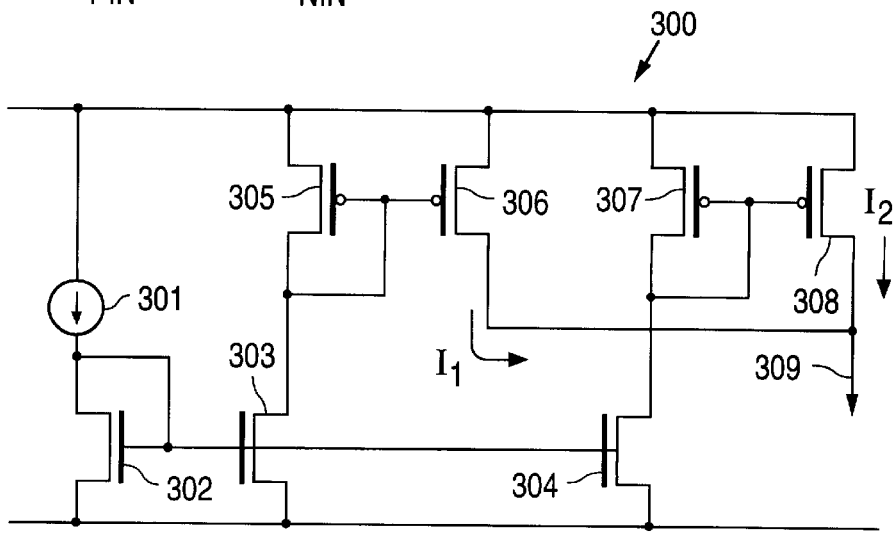
FIG. 2 shows an improved current source 300 with a compensating current for process variations, in accordance with the present invention.

FIG. 2 shows a current source 300 with a compensation current for process variations, suitable for use in generating bias currents. As shown in FIG. 2, a current source 301 generates a current I which is mirrored by NMOS transistor 302 to provide current I in each of NMOS transistors 303 and 304. The currents in NMOS transistors 303 and 304 are mirrored by PMOS transistors 305 and 307 to provide, upon predetermined scaling of PMOS transistors 305 and 307, currents $I_1$ and $I_2$ in PMOS transistors 306 and 308, respectively. Currents $I_1$ and $I_2$ are combined and output at terminal 309. In current source 300, PMOS transistor 306 is provided a channel length much longer than the channel length of PMOS transistor 308, thereby rendering PMOS transistor 306 to be much less sensitive on a percentage basis to variations in channel length due to process variations. In one embodiment, PMOS transistor 306 is provided a width of 10 microns and a channel length of 3.2 microns, while PMOS transistor 308 is provided a width of 24 microns and a channel length of 0.48 microns. Consequently, in that embodiment, current $I_1$ is approximately 1/16 or 6.25% of current $I_2$. Thus, PMOS transistor 306 corrects for a process variation of about 6% in PMOS transistor 308. Such compensation are especially advantageous when the compensated current is used in a differential amplifier. With a reliable reference current generated by a current source of the present invention, the operational bandwidth of the differential amplifier can be increased by as much as 25%.

The above detailed description is provided to illustrate the specific embodiments of the present invention and is not intended to be limiting. Numerous variations and modifications within the scope of the present invention are possible. The present invention is set forth in the following claims.

I claim:

1. A common mode feedback circuit providing a common mode feedback signal at an output terminal based on a differential signal, comprising:

a first circuit receiving said differential signal and a first clock signal, the first circuit providing, during an active phase of said first clock signal, at said output terminal a voltage substantially equal to a common mode voltage component of said differential signal plus a bias voltage; and a second circuit receiving said differential signal and a second clock signal, said second clock signal being active during an inactive phase of said first clock signal, said second circuit providing, during an active phase of said second clock signal, at said output terminal a voltage approximating said common mode voltage component of said differential signal plus said bias voltage.

2. A common mode feedback circuit as in claim 1, wherein said first circuit further comprises:

a current source;

a capacitor; and a control circuit for coupling said current source to said capacitor for charging said capacitor during an inactive phase of said first clock signal, said capacitor providing said bias voltage during said active phase of said first clock signal.

3. A common mode feedback circuit as in claim 1, wherein said control circuit coupling said first circuit to said output terminal during said active phase of said first clock signal.

4. A common mode feedback circuit as in claim 2, wherein said control circuit comprises transistor switches controlled by said first clock signal.

5. A common mode feedback circuit as in claim 4, wherein said capacitor includes a first component capacitor and a second component capacitor, said control circuit coupling, during said inactive phase of said clock signal, said first and second component capacitors in parallel for charging by said current source, and said control circuit coupling said first and second component capacitors in series during said active phase of said clock signal, such that a common terminal of said first and second component capacitors provide said voltage.

6. A common mode feedback circuit as in claim 1, wherein said differential signal is an output signal of a differential amplifier and said output terminal is coupled to control a control terminal of said differential amplifier for compensating any common mode voltage component of said output signal.

7. A method for providing a common mode feedback signal based on a differential signal, said method comprising:

providing as said common mode feedback signal, during an active phase of a first clock signal, a voltage substantially equal to a common mode voltage component of said differential signal plus a bias voltage; and providing as said common mode feedback signal, during an active phase of a second clock signal, said second clock signal being active during an inactive phase of said first clock signal, a voltage substantially equal to said common mode voltage component of said differential signal plus said bias voltage.

8. A method as in claim 7, further comprising:

charging a capacitor during an inactive phase of said first clock signal, said capacitor providing said bias voltage during said active phase of said first clock signal.

9. A method as in claim 8, further comprising providing transistor switches controlled by said first clock signal for multiplexing between providing said common mode feedback voltage and charging said capacitor.

10. A method as in claim 7, wherein said differential signal is received from an output signal of a differential amplifier and said common mode feedback signal is provided to a control terminal of said differential amplifier for compensating any common mode voltage component of said output signal.

11. A current source providing an output current, comprising:

a first transistor having an output terminal and a control terminal, said first transistor having a first channel length, said first transistor receiving a reference voltage at said control terminal and generating a first current at said output terminal, and a second transistor having an output terminal and an input terminal, said second transistor having a second channel length longer than said channel length of said first transistor, said second transistor receiving at its control terminal said reference voltage and generating at its output terminal a second current; wherein said output terminal of said first transistor and said output terminal of said second transistor are coupled to provide said output current as a sum of said first current and said second current.

12. A method for providing an output current, comprising:

coupling a first transistor of a first channel length, such that said first transistor receives a reference voltage at a control terminal and generates a first current at an output terminal;

coupling a second transistor of a second channel length longer than said channel length of said first transistor, such that said second transistor receives at its control terminal said reference voltage and generates at its output terminal a second current; and combining said first and second currents to provide said output current.

* * * * *